United States Patent
Giusti et al.

(10) Patent No.: US 12,465,948 B2
(45) Date of Patent: Nov. 11, 2025

(54) PMUT ARRAY WITH PRESENCE OF SEPARATE SENSING SMALL PZT ON MEMBRANES EDGE

(71) Applicant: STMicroelectronics International N.V., Geneva (CH)

(72) Inventors: Domenico Giusti, Caponago (IT); Marco Ferrera, Concoerezzo (IT); Fabio Quaglia, Pizzale (IT)

(73) Assignee: STMicroelectronics International N.V., Geneva (CH)

( * ) Notice: Subject to any disclaimer, the term of this patent is extended or adjusted under 35 U.S.C. 154(b) by 405 days.

(21) Appl. No.: 18/107,893

(22) Filed: Feb. 9, 2023

(65) Prior Publication Data

US 2024/0269708 A1 Aug. 15, 2024

(51) Int. Cl.
*B06B 1/06* (2006.01)
*B06B 1/02* (2006.01)
(Continued)

(52) U.S. Cl.
CPC .......... *B06B 1/0622* (2013.01); *B06B 1/0666* (2013.01); *H10N 30/2047* (2023.02);
(Continued)

(58) Field of Classification Search
CPC ......... H10N 30/101; H10N 30/20–208; H10N 30/30–308; H10N 30/50–508; H10N 30/88; B06B 1/0622–064
See application file for complete search history.

(56) References Cited

U.S. PATENT DOCUMENTS 10,001,552 B2 6/2018 Panchawagh et al.
11,005,025 B1 * 5/2021 Horsley ............ G01N 29/2437
(Continued)

FOREIGN PATENT DOCUMENTS

WO 2016106153 A1 6/2016
WO WO-2023277914 A1 * 1/2023 ........... A61B 8/4483

OTHER PUBLICATIONS

Birjis, Yumna, et al.: "Piezoelectric Micromachined Ultrasonic Transducers (PMUTs): Performance Metrics, Advancements, and Applications," Sensors 2022, 22, 9151; doi.org/10.3390/s22239151, 29 pgs.

(Continued)

*Primary Examiner* — Scott B Geyer
(74) *Attorney, Agent, or Firm* — Crowe & Dunlevy LLC

(57) ABSTRACT

Disclosed herein is an array of ultrasound devices. Each ultrasound device includes a first piezoelectric stack carried by a membrane and forming, together with the membrane, a first piezoelectric micromachined ultrasonic transducer (PMUT), and a plurality of second piezoelectric stacks carried by the membrane and positioned about a periphery thereof, each second piezoelectric stack forming, together with the membrane, a second PMUT. During operation, the first piezoelectric stack is configured to vibrate the membrane in response to application of an alternating voltage to the first piezoelectric stack to thereby generate at least one outgoing ultrasonic pulse toward a target, and during operation, the plurality of second piezoelectric stacks are configured to generate sense voltages in response to bending thereof induced by vibration of the membrane by incoming ultrasonic reflections off the target.

20 Claims, 17 Drawing Sheets

(51) Int. Cl.
*H10N 30/20* (2023.01)
*H10N 30/30* (2023.01)
*H10N 30/50* (2023.01)

(52) U.S. Cl.
CPC ........... *H10N 30/308* (2023.02); *H10N 30/50* (2023.02); *B06B 1/0215* (2013.01)

(56) References Cited

U.S. PATENT DOCUMENTS

| | | | |
|---|---|---|---|
| 11,498,097 B2 | 11/2022 | Kumar et al. | |
| 11,526,018 B2* | 12/2022 | Senkal | G01S 15/8915 |
| 11,865,581 B2* | 1/2024 | Gattere | B81B 7/0016 |
| 2002/0105250 A1* | 8/2002 | Klee | H10N 30/2047 |
| | | | 310/365 |
| 2012/0319535 A1* | 12/2012 | Dausch | H10N 30/2047 |
| | | | 310/365 |
| 2015/0139452 A1* | 5/2015 | Park | H04R 23/00 |
| | | | 381/150 |
| 2015/0357375 A1* | 12/2015 | Tsai | H10N 30/302 |
| | | | 257/416 |
| 2017/0128983 A1* | 5/2017 | Horsley | H10N 30/875 |
| 2017/0246662 A1* | 8/2017 | Kidwell, Jr. | A61B 8/4494 |
| 2017/0320093 A1* | 11/2017 | Chatterjee | B06B 1/0629 |
| 2017/0322290 A1* | 11/2017 | Ng | H10N 30/2047 |
| 2017/0365774 A1* | 12/2017 | Rothberg | H05K 3/361 |
| 2018/0178251 A1* | 6/2018 | Foncellino | B06B 1/0622 |
| 2018/0257927 A1* | 9/2018 | Rothberg | B81C 1/00238 |
| 2019/0193116 A1* | 6/2019 | Horsley | G10K 9/122 |
| 2020/0055088 A1* | 2/2020 | Okada | A61B 8/4483 |
| 2020/0194658 A1* | 6/2020 | Guedes | H10N 30/883 |
| 2020/0257366 A1* | 8/2020 | Casset | G06F 3/011 |
| 2020/0269280 A1* | 8/2020 | Rothberg | H10N 30/04 |
| 2020/0338592 A1* | 10/2020 | Goericke | B06B 1/0666 |
| 2021/0276044 A1* | 9/2021 | Vercesi | H10N 30/706 |
| 2021/0362189 A1* | 11/2021 | Kumar | B81B 3/0021 |
| 2022/0048072 A1* | 2/2022 | Qian | B81C 1/00158 |
| 2022/0118480 A1* | 4/2022 | Giusti | B81B 7/0016 |
| 2023/0019457 A1* | 1/2023 | Kämpfe | H10N 30/2047 |
| 2023/0129720 A1* | 4/2023 | Giusti | G01L 9/008 |
| | | | 257/415 |
| 2023/0142065 A1* | 5/2023 | Kuroda | H10N 30/20 |
| | | | 310/316.01 |
| 2023/0302494 A1* | 9/2023 | Lin | B06B 1/0622 |
| 2024/0024916 A1* | 1/2024 | Kraft | B06B 1/0292 |
| 2024/0205611 A1* | 6/2024 | Giusti | B06B 1/0622 |
| 2024/0272298 A1* | 8/2024 | Giusti | G01S 15/8927 |

OTHER PUBLICATIONS

Thao, Pham N., et al.: "Development of Mechanically-Robust Piezoelectric Micromachined Ultrasonic Transducer (PMUT) With Island-Shaped PZT Monocrystalline Thin Film," Transducers 2019—Eurosensors XXXIII, Jun. 23-27, 2019, 4 pgs.

Shin, Eunjung, et al.: "Development of a High-Density Piezoelectric Micromachined Ultrasonic Transducer Array Based on Patterned Aluminum Nitride Thin Film," Micromachines 2020, 11, 623; doi:10.3390/mi11060623, 10 pgs.

Kaputa, David, et al.: "An Ultrasound Based Eye Tracking System," Journal of Biomedical Engineering and Medical Devices, 2016, 4 pgs.

Sun, Sheng, et al.: "Eye-Tracking Monitoring Based on PMUT Arrays," Journal of Microelectromechanical Systems, vol. 31, No. 1, Feb. 2022, pp. 45-53.

Sun, Sheng, et al.: "MEMS Ultrasonic Transducers for Safe, Low-Power and Portable Eye-Blinking Monitoring," Microsystems & Nanoengineering, https://doi.org/10.1038/s41378-022-00396-w, 2022, 14 pgs.

* cited by examiner

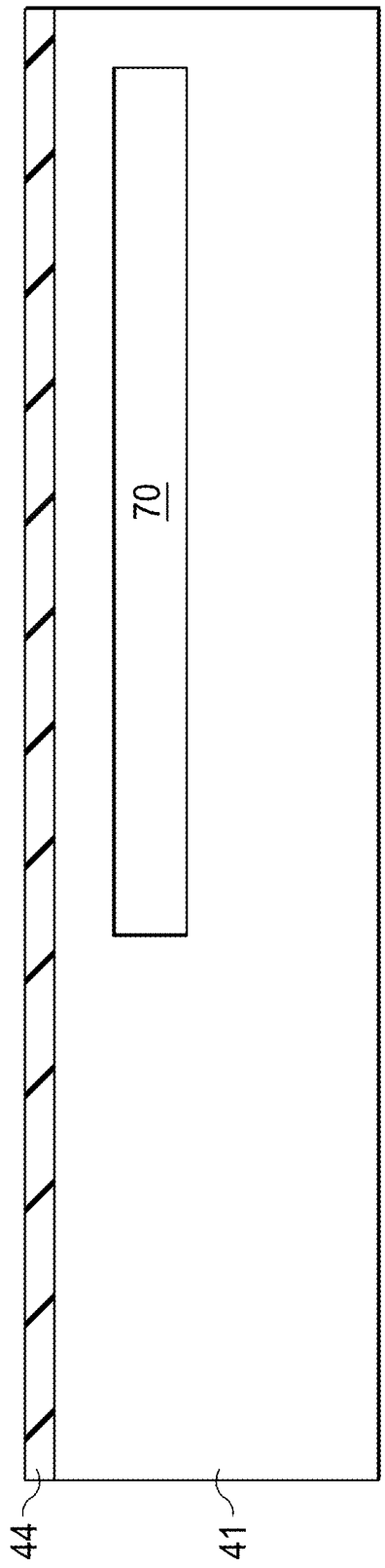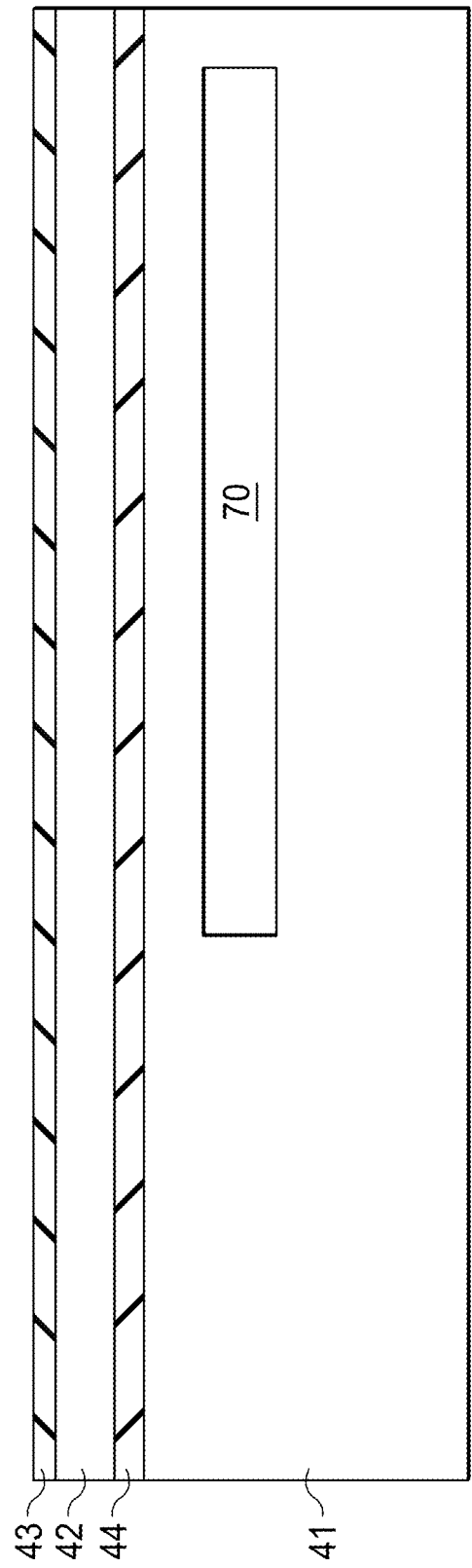

PMUT ARRAY WITH PRESENCE OF SEPARATE SENSING SMALL PZT ON MEMBRANES EDGE

TECHNICAL FIELD

This disclosure is related to the field of piezoelectric micromachined ultrasound transducers (PMUTs) and, in particular, to a design for an array of PMUTs in which certain PMUTs are placed at specific locations about the perimeter of the membrane.

BACKGROUND

Virtual and augmented reality devices include wearable headsets or glasses that function to display images to users in a fashion that either replaces the user's currently visually perceived reality with a projected "virtual" reality or that overlays images over the user's currently visually perceived reality to "augment" that reality. In certain virtual and augmented reality devices, it is desired for the virtual or augmented reality device to be able to track the eye movements of the user so as to be able provide the user with a virtual or augmented reality that changes with the user's eye position.

Certain known techniques for tracking eye movements are more effective at tracking soft pursuit by the eye (e.g., following an object with the eye or reading) than tracking fast pursuit by the eye (e.g., saccades; a rapid eye movement that shifts the center of the eye's gaze from one part of the visual field to another, such as for orienting the eye's gaze toward an object of interest). However, tracking both soft pursuit and fast pursuit is desired.

Eye tracking involves tracking the distance between a sensing device and parts of the eye (e.g., sclera, cornea). As the eye rotates within the eye socket, the distance between the sensing device and those parts of the eye changes. The position of the eye can be determined from the changes in these distances. The challenge in tracking fast pursuit eye movement is that such tracking requires a high sampling rate.

One technology that may be used to track eye movements is ultrasonic sensing in which ultrasonic waves are emitted toward the eye and reflections of the ultrasonic waves off the eye are detected. By measuring the time of flight of those ultrasound waves, distance to parts of the eye can be determined.

One type of ultrasound sensing technology involves micromachined ultrasound transducers (MUTs), and in particular those referred to as piezoelectric micromachined ultrasound transducers (PMUTs).

A PMUT element is formed by a membrane suspended over a cavity carrying a layer of piezoelectric material sandwiched between thin electrode layers. The sandwiching of the piezoelectric material between the thin electrode layers can be thought of as a parallel plate capacitor with a piezoelectric layer between the plates. In operation, a voltage is applied across the electrodes, resulting in a lateral strain being induced in the membrane via the piezoelectric effect causing movement of the piezoelectric layer. By applying a suitable AC voltage between the electrodes oscillation of the membrane is induced and an ultrasound wave is generated.

For use to track eye movements, an ultrasound device includes an array of PMUT elements and a transceiver driver circuit. Conventionally, the transceiver driver circuit includes a transmitter portion and a receiver portion. The transmitter portion utilizes a high voltage pulse generate to generate a pulse wave signal for the piezoelectric material of the PMUTs. In the receiver portion, the voltages induced in the piezoelectric material of the PMUTs by the vibration of the membrane by received ultrasonic waves are amplified, filtered, and processed. A typical operation cycle includes a transmission period and a reception period, and during the reception period, a high voltage switch is used to disconnect the transmitter portion so eliminate potential interference with the voltages induced in the piezoelectrical material of the PMUTs by the detected returning ultrasound waves (e.g., the echo signal) because the same PMUTs are used for both ultrasound generation and ultrasound detection.

Problems may arise in that the high voltage switch itself may introduce unwanted noise. Given this, further development is needed.

SUMMARY

Disclosed herein is an array of ultrasound devices, each including: a membrane; a first piezoelectric stack carried by the membrane and forming, together with the membrane, a first piezoelectric micromachined ultrasonic transducer (PMUT); and a plurality of second piezoelectric stacks carried by the membrane and positioned about a periphery thereof, each second piezoelectric stack forming, together with the membrane, a second PMUT. During operation, the first piezoelectric stack is configured to vibrate the membrane in response to application of an alternating voltage to the first piezoelectric stack to thereby generate at least one outgoing ultrasonic pulse toward a target. Also during operation, the plurality of second piezoelectric stacks are configured to generate sense voltages in response to bending thereof induced by vibration of the membrane by incoming ultrasonic reflections off the target.

Each ultrasound device may have a plurality of cutouts formed in its membrane about the periphery thereof, each cutout being formed in a dielectric layer that is a top layer of the membrane.

The first piezoelectric stack may be carried atop a central portion of the membrane.

The plurality of second piezoelectric stacks may be three in number and carried atop the periphery of the membrane so that the plurality of second piezoelectric stacks form a Y-shape, X-shape, or star-shape.

The Y-shape, X-shape, or star-shape may be symmetric.

The plurality of second piezoelectric stacks may be carried atop the periphery of the membrane so that the plurality of second piezoelectric stacks are spaced equidistant from one another.

Control circuitry may be configured to drive the first piezoelectric stack to cause the first piezoelectric stack to generate the at least one outgoing ultrasonic pulse while monitoring output from the plurality of second piezoelectric stacks to determine an elapsed time between emission of the at least one outgoing ultrasonic pulse and receipt of the incoming ultrasonic reflections.

The control circuitry may also monitor the output from the plurality of second piezoelectric stacks to detect the vibration of the membrane caused by generation of the at least one outgoing ultrasonic pulse and to determine whether a given first piezoelectric stack has malfunctioned based upon a lack of detection of the vibration of the membrane.

Each of the plurality of second piezoelectric stacks may be lesser in diameter than the first piezoelectric stack.

Another array of ultrasound devices is disclosed herein, with each ultrasound device including: a membrane; a first piezoelectric stack carried by the membrane and forming, together with the membrane, a first piezoelectric micromachined ultrasonic transducer (PMUT); a plurality of second piezoelectric stacks carried by the membrane and positioned about a periphery thereof, each second piezoelectric stack forming, together with the membrane, a second PMUT; and a plurality of cutouts formed in the membrane about the periphery thereof, each cutout being formed in a dielectric layer that is a top layer of the membrane.

The first piezoelectric stack may be carried atop a central portion of the membrane.

The plurality of second piezoelectric stacks may be three in number and carried atop the periphery of the membrane so that the plurality of second piezoelectric stacks form a Y-shape, X-shape, or star-shape. The Y-shape, X-shape, or star-shape may be symmetric.

The plurality of second piezoelectric stacks may be carried atop the periphery of the membrane so that the plurality of second piezoelectric stacks are spaced equidistant from one another.

Each of the plurality of second piezoelectric stacks may be lesser in diameter than the first piezoelectric stack.

Also disclosed herein is an ultrasound device including: a membrane; a first piezoelectric stack carried by the membrane and forming, together with the membrane, a first piezoelectric micromachined ultrasonic transducer (PMUT); a plurality of second piezoelectric stacks carried by the membrane and positioned about a periphery thereof, each second piezoelectric stack forming, together with the membrane, a second PMUT, each second piezoelectric stack being lesser in diameter than the first piezoelectric stack; a plurality of cutouts formed in the membrane about the periphery thereof, each cutout being formed in a dielectric layer that is a top layer of the membrane; and control circuitry configured to drive the first piezoelectric stack to cause the first piezoelectric stack to generate the at least one outgoing ultrasonic pulse while monitoring output from the plurality of second piezoelectric stacks to determine an elapsed time between emission of the at least one outgoing ultrasonic pulse and receipt of the incoming ultrasonic reflections.

The first piezoelectric stack may be carried atop a central portion of the membrane.

The plurality of second piezoelectric stacks may be three in number and carried atop the periphery of the membrane so that the plurality of second piezoelectric stacks form a Y-shape, X-shape, or star-shape. The Y-shape, X-shape, or star-shape may be symmetric.

The plurality of second piezoelectric stacks may be carried atop the periphery of the membrane so that the plurality of second piezoelectric stacks are spaced equidistant from one another.

BRIEF DESCRIPTION OF THE DRAWINGS

FIGS. 8A-8F show an alternate process flow for forming the membranes of PMUT devices described above.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
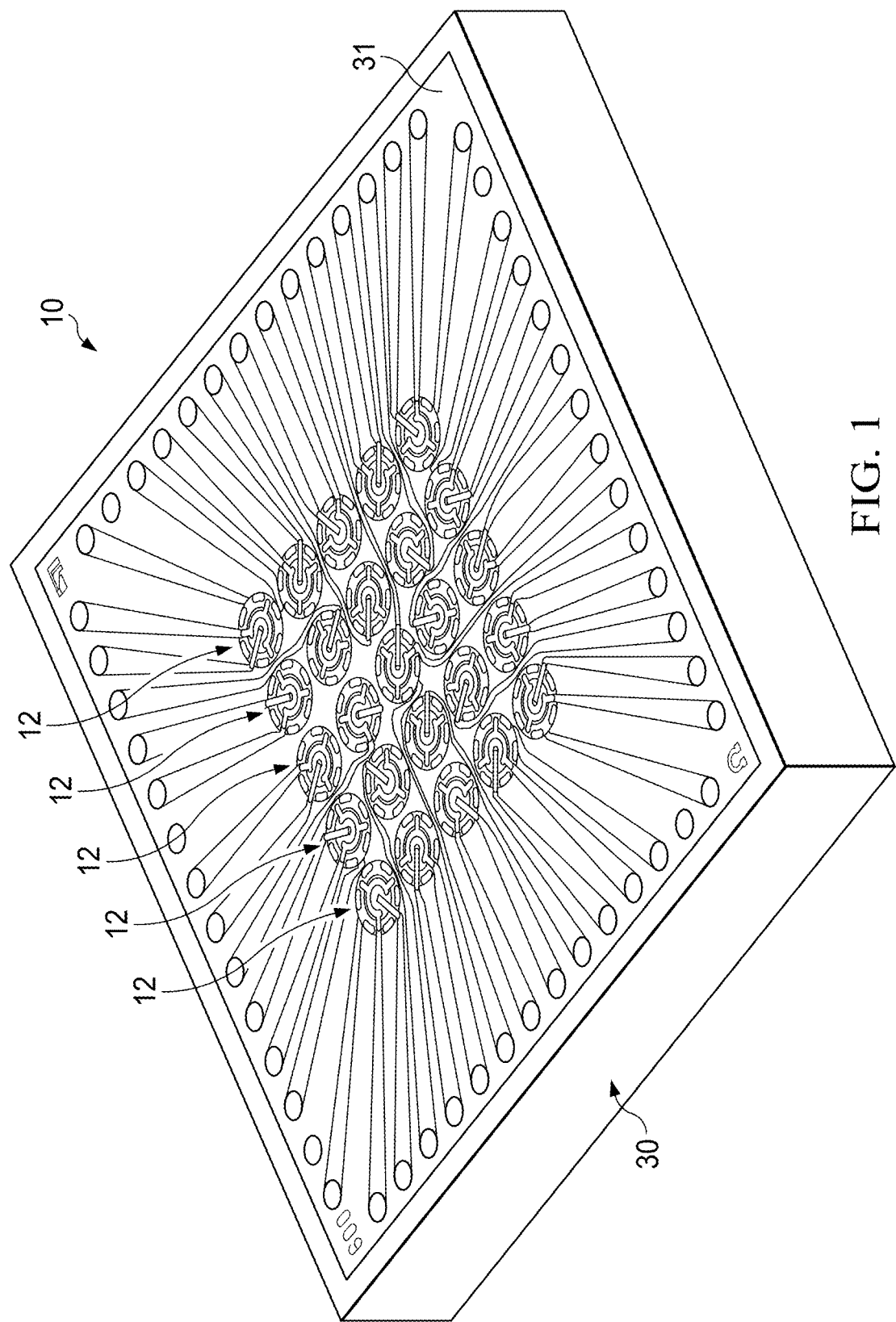
FIG. 1 is a perspective view of an ultrasound imaging array including an array of PMUT units as disclosed herein.

Now described with reference to FIGS. 1-4 is an ultrasound imaging array 10. As best shown in FIG. 1, the array 10 is formed of piezoelectric micromachined ultrasound transducer (PMUT) units 12 arranged in a desired pattern (illustratively a 5-by-5 matrix, but any suitable pattern may be utilized) on a top layer 31 of a support substrate 30.

Figure 2:
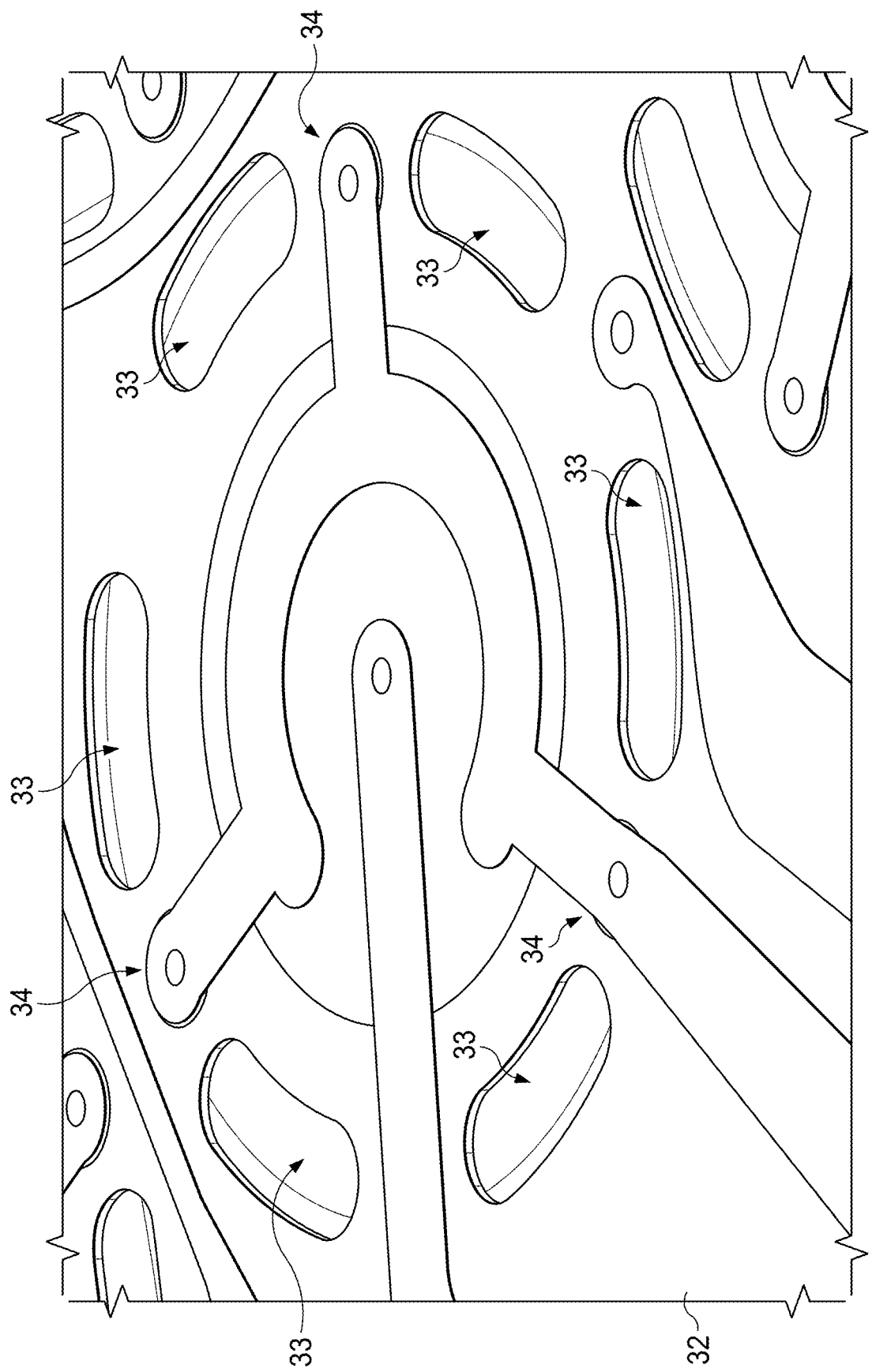
FIG. 2 is a greatly enlarged perspective view of one of the PMUT units of the array as disclosed herein.
Figure 3:
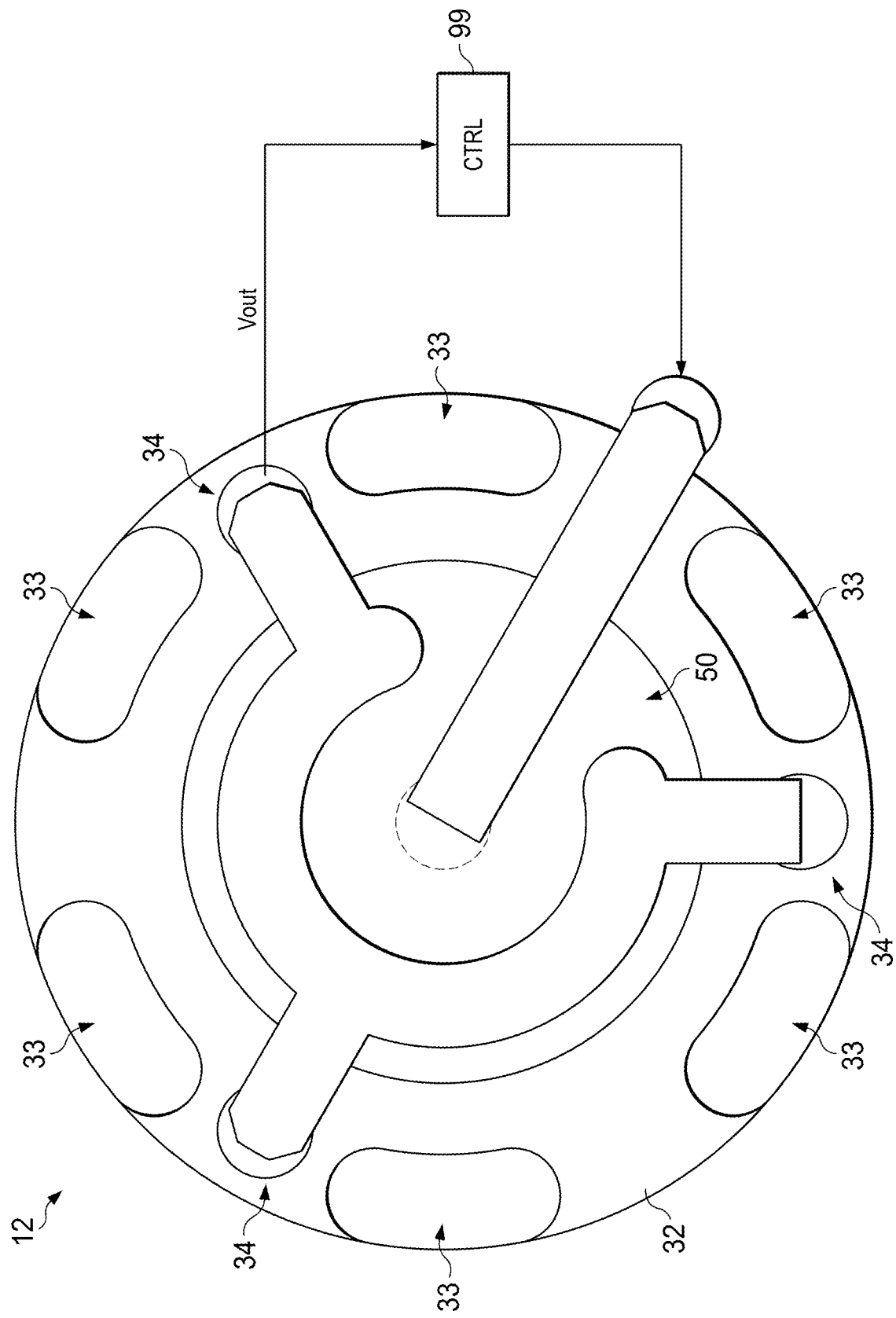
FIG. 3 is a top view of one of the PMUT units of the array as disclosed herein.
Figure 4:
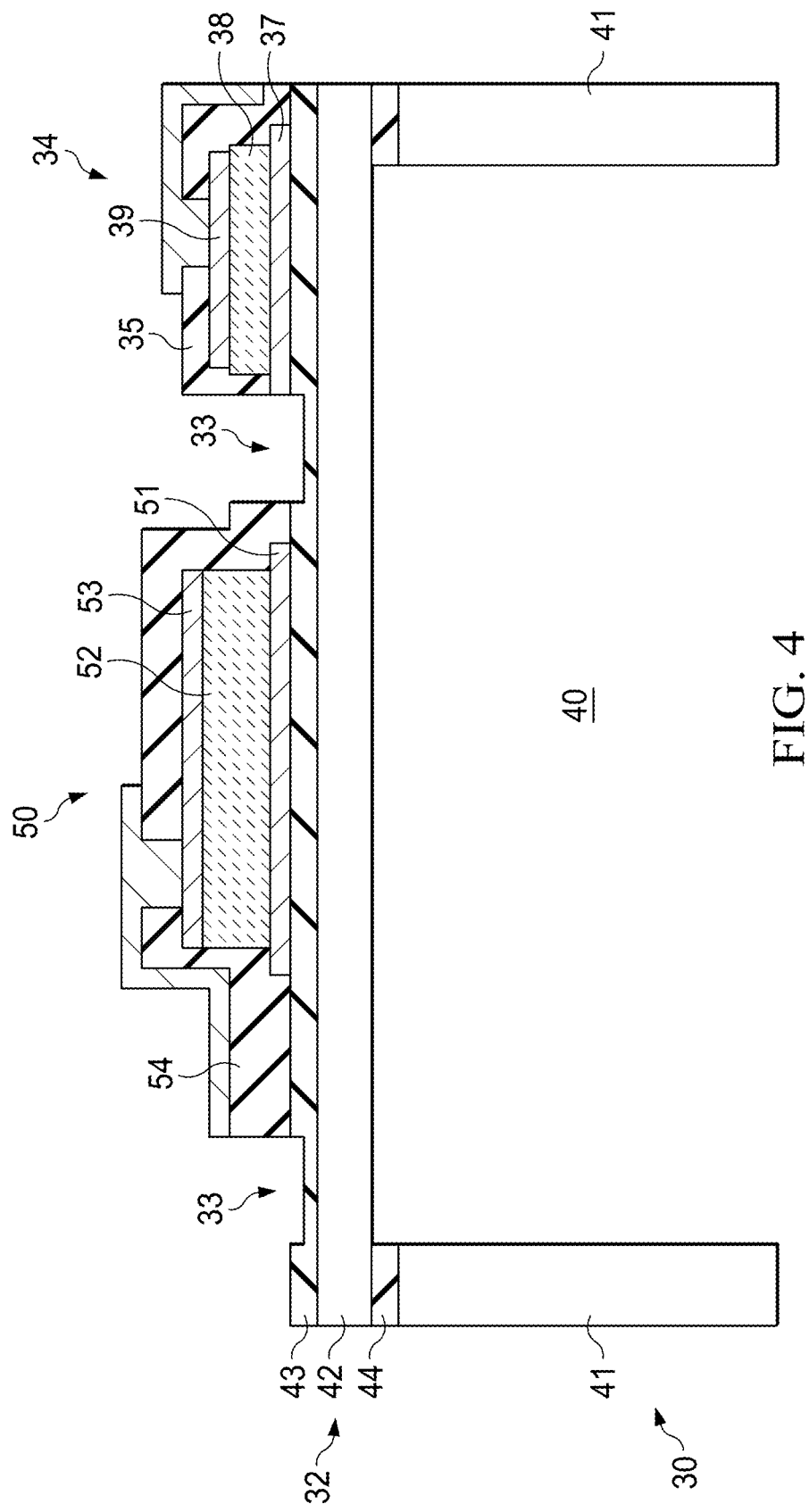
FIG. 4 is a cross sectional view of the PMUT unit of FIG. 3.

Referring now to FIGS. 2-4, each PMUT unit 12 includes a membrane 32 (formed of a thinned portion of the top layer 31 of the support substrate 30). In each PMUT unit 12, a transmitter PMUT 50 is centrally located on the membrane 32, with three receiver PMUTs 34 positioned about the periphery of the membrane 32 and arranged into a symmetric Y-shape with respect to one another. The symmetric Y-shape serves to avoid the introduction of unwanted resonance modes.

As alternatives, the three receiver PMUTs 34 positioned about the periphery of the membrane 32 may be arranged into an X-shape or a star-shape with respect to one another, and these shapes also serve to avoid the instruction of unwanted resonance modes.

The membrane 32 is suspended across a cavity 40 formed in the substrate 30 by a sidewall 41 that runs about a perimeter of the membrane 32. The membrane 32 is formed by an epitaxial layer 42 carried atop a dielectric layer 44 stacked on the sidewall 41, with a dielectric layer 43 stacked on the epitaxial layer 42.

Each transmitter PMUT 50 includes a first electrode 51 stacked on the dielectric layer 43, a piezoelectric layer 52 stacked on the first electrode 51, and a second electrode 53 stacked on the piezoelectric layer 52 such that the piezoelectric layer 52 is sandwiched between the first electrode 51 and second electrode 53. A dielectric coating 54 surrounds the sides of the first electrode 51, piezoelectric layer 52, and second electrode 53.

Each receiver PMUT 34 includes a first electrode 37 stacked on the dielectric layer 43, a piezoelectric layer 38 stacked on the first electrode 37, and a second electrode 39 stacked on the piezoelectric layer 38 such that the piezoelectric layer 38 is sandwiched between the first electrode 37 and second electrode 39. A dielectric coating 35 surrounds the sides of the first electrode 37, piezoelectric layer 38, and second electrode 39.

The first electrodes 37 of each receiver PMUT 34 and the first electrode 51 of each transmitter PMUT 50 are coupled to ground. During operation, a time-varying drive voltage is applied by control circuitry 99 to the second electrodes 53 of each transmitter PMUT 50 to cause vibration of the membrane 32 to generate one or a series of ultrasonic pulses toward an intended target, and the voltages at the second electrodes 39 of each receiver PMUT 34 are measured by the control circuitry 99 to detect reflections of the one or more ultrasonic pulses off the intended target. By measuring the elapsed time between pulse generation and reflection detection, distances to different parts of the human eye can be determined by the control circuitry 99 and in turn movement of the eye can be tracked.

It has been found that the dielectric layer 43 contributes to variability in the intrinsic response of the membrane 32 to the stresses imparted during operation between different PMUT units 12, between different arrays 10 (each being formed on its own die), and between different wafers on which the dies are formed. This variability may lead to different membranes 32 having different resonance frequencies, which is undesirable because it may lead to inconsistent performance between different PMUT units 12, dies, and wafers. To address this, as best shown in FIGS. 2-4, cutouts 33 are formed in the dielectric layer 43 about the periphery of the membrane 32. The cutouts 33 help ensure that each membrane 32 of the array 10 has approximately the same resonance frequency, thereby increasing stability of an ultrasound imaging device incorporating the array 10. In fact, it is desirable for as much of the dielectric layer 43 that can be removed (given the process used to form the array 10) be removed—ideally therefore, the dielectric layer 43 would be removed to form the cutouts 33 from all locations other than underneath the transmitter PMUT and receiver PMUTs 34, although process (and conductor routing) limit this in current implementations. Nevertheless, in the arrangement of cutouts 33 shown in FIGS. 2-4 are highly effective in increasing stability as described above.

Attention is now drawn to the relative size difference between the transmitter PMUT 50 and the receiver PMUTs 34—the transmitter PMUT 50 is substantially larger in diameter than the receiver PMUTs 34. It has been found that piezoelectric material has a high electric permeability. The high electric permeability of piezoelectric material therefore means that PMUTs have a relatively high capacitance for their given size. When a PMUT is used as a sensor to sense ultrasonic waves that have reflected off a target and returned to the array 10, it acts as a parallel plate capacitor that is charged/discharged by the movement imparted to the membrane which carries the PMUT. The larger the capacitance of the receiver PMUTs 34 therefore, the smaller the output voltage that results from detection of ultrasonic waves. To address this, the receiver PMUTs 34 are substantially smaller than the transmitter PMUT 50.

Figure 5:
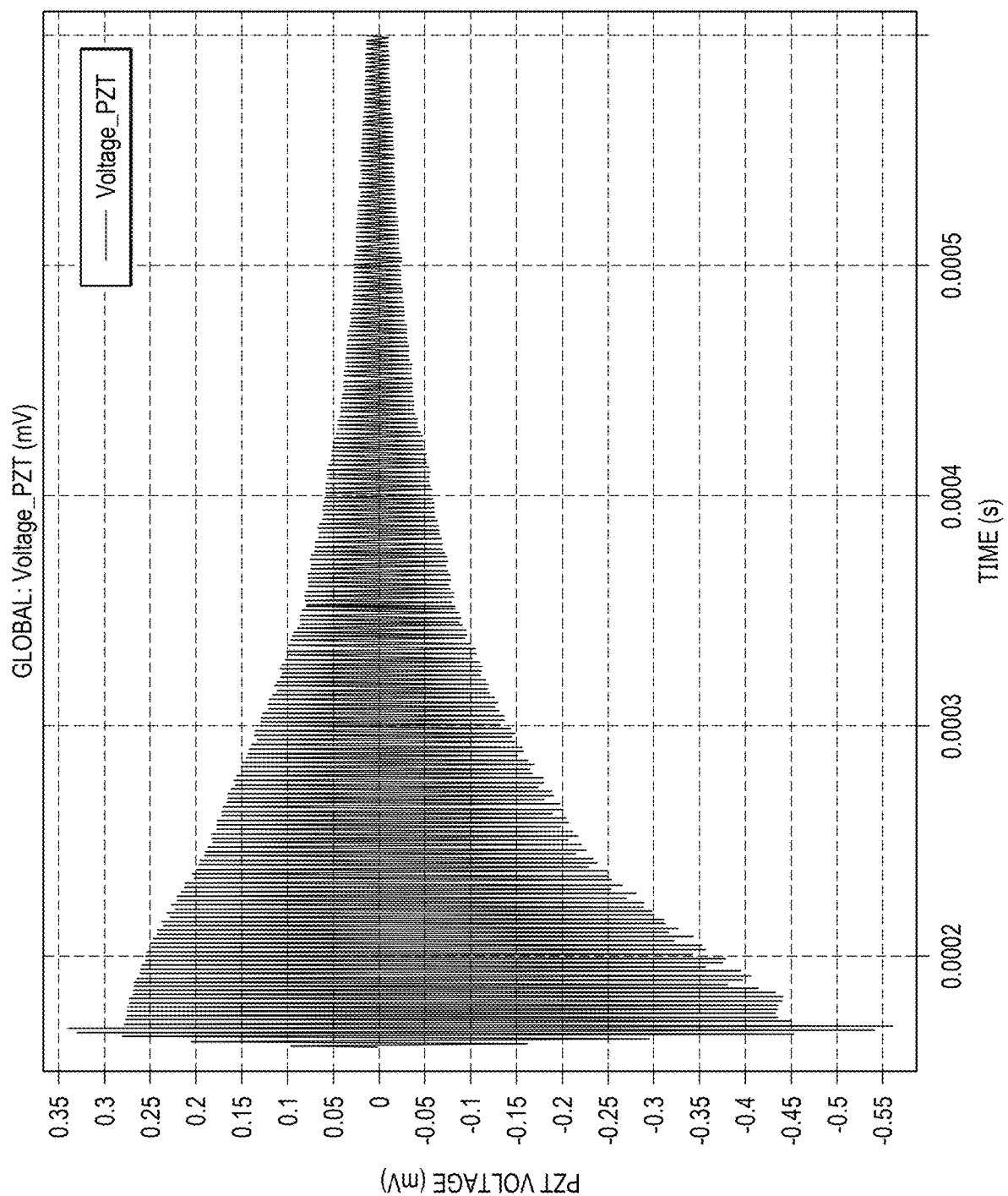
FIG. 5 is a graph showing the output voltage from the transmitter PMUT of FIG. 3 if it were used as a receiver PMUT.
Figure 6:
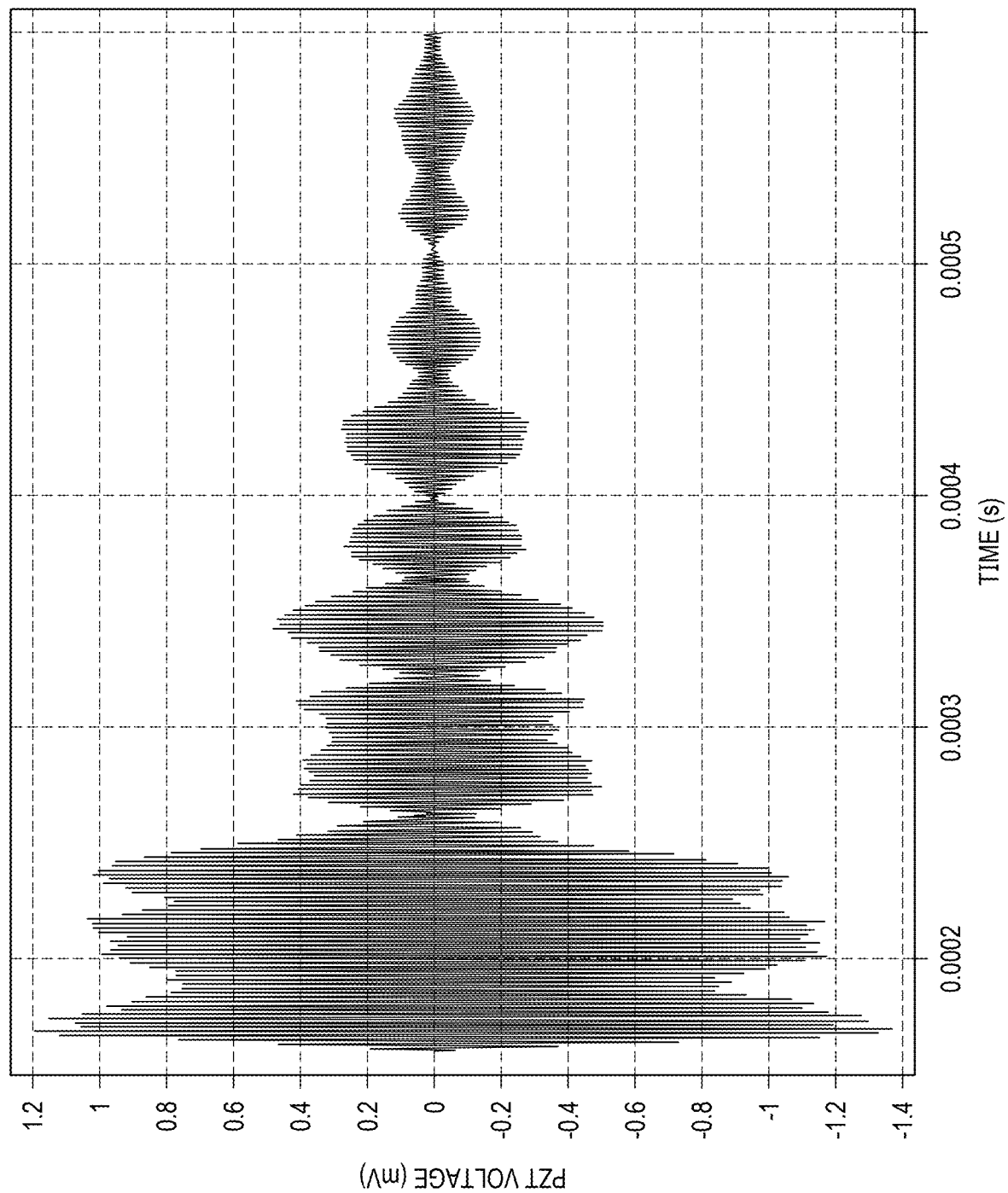
FIG. 6 is a graph showing the output voltage from the receiver PMUT of FIG. 3.

A graph of the voltage output by the piezoelectric material 52 of the transmitter PMUT 50 if the transmitter PMUT 50 were to be used as a receiver can be observed in FIG. 5—the maximum output voltage swing for this specific example is 0.75 Vpp, with the sensitivity of the PMUT 50 being 0.46 mV/Pa. However, as can be observed in FIG. 6 showing a graph of the voltage output by the piezoelectric material 38 of the receiver PMUTs 34, the maximum output voltage swing for this specific example is 2.2 mV while the sensitivity of the PMUT 50 is 1.1 mV/PA. Therefore, by using substantially smaller receiver PMUTs 34 positioned about the periphery of the membrane 32 (which is the highest stressed zone of the membrane 32), the output voltage when detecting ultrasound is increased by a factor of three and the sensitivity is increased by a factor of nearly 2.5. Also, with this design, through selecting the size and number of receiver PMUTs, impact on the ratio between piezoelectric material diameter and membrane diameter can be avoided.

Moreover, owing to the fact that the array 10 utilizes separate transmitter PMUTs 50 and receiver PMUTs 34, the concern raised above relative to the high voltage switch in prior art designs which use the same PMUT devices for both ultrasound generation and ultrasound detection is eliminated because the high voltage switch is eliminated. Still further, due to this use of separate transmitter PMUTs 50 and receiver PMUTs 34, the receiver PMUTs 34 can be operated so as to continually perform detection during operation and therefore act to provide information used to determine whether their respective transmitter PMUTs 50 have failed—if the receiver PMUTs 34 of a given PMUT unit 12 do not detect movement of their respective membrane 32 when their driver PMUT 50 is supposed to be generating an ultrasonic pulse or pulses, it can therefore be inferred by the control circuitry 99 that the transmitter PMUT 50 has failed. Additionally, the voltage differential applied between the electrodes of the transmitter PMUT 50 can be different than the voltage differential applied between the electrodes of the receiver PMUTs 34.

Figure 7A:
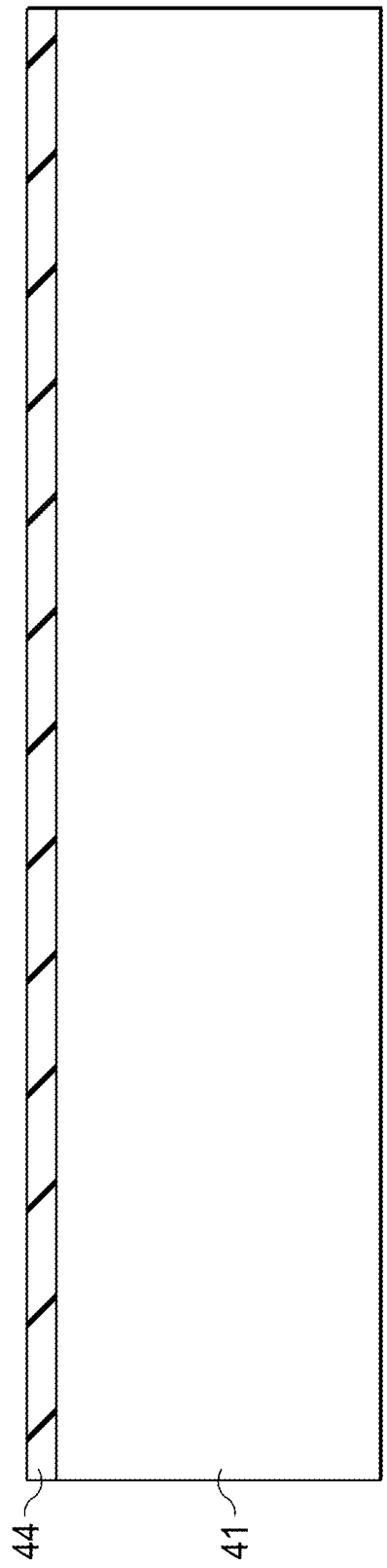
FIGS. 7A-7F show a process flow for forming the membranes of PMUT devices described above.
Figure 7B:
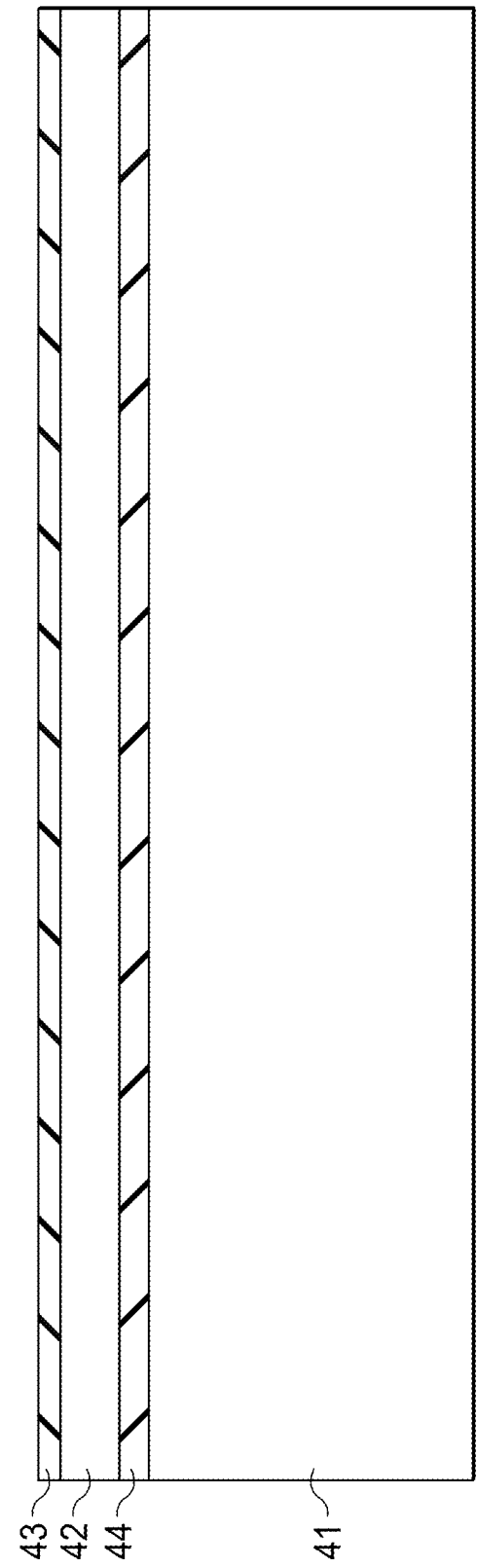

The process flow for forming the array 10 is now described with reference to FIGS. 7A-7F. To begin, a tetraethyl orthosilicate (TEOS) layer 44 is deposited on a silicon wafer substrate 41, as shown in FIG. 7A. Then, a structural layer 42 is epitaxially grown on the TEOS layer 44 and chemically-mechanically polished (CMP), as shown in FIG. 7B. A second TEOS layer 43 is then deposited on the structural layer 42, as also shown in FIG. 7B.

Figure 7C:
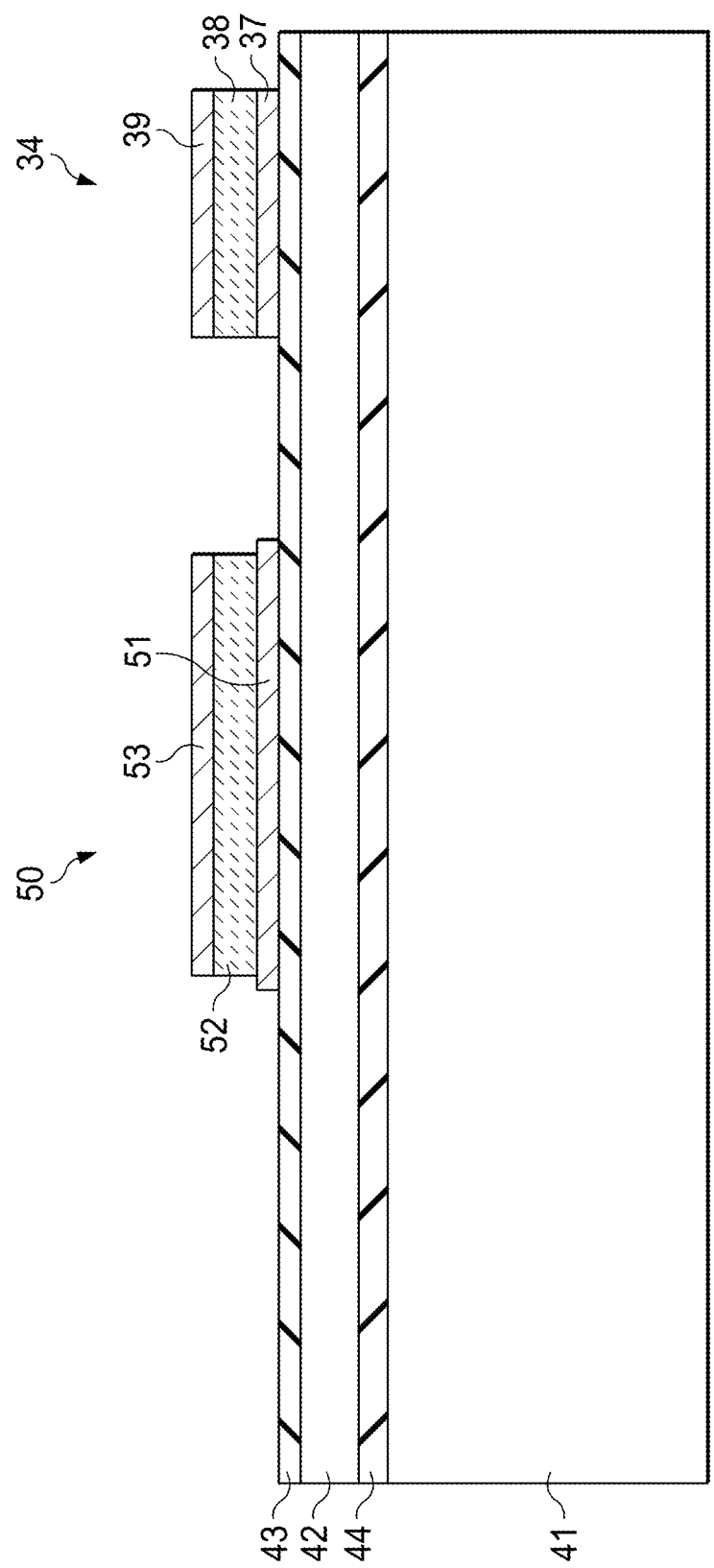

A first piezoelectric stack 50 forming the transmitter PMUT together with the underlying membrane (once formed) and second piezoelectric stacks 34 forming the receiver PMUTs together with the underlying membrane are then formed on the second TEOS layer 43, as shown in FIG. 7C. This is performed by deposition and patterning of, in order, tungsten-titanium, lead zirconate titanate (PZT), and platinum. Once formed, the first piezoelectric stack 50 includes an electrode 51 stacked on the second TEOS layer 43, a piezoelectric layer 52 stacked on the electrode 51, and an electrode 53 stacked on the piezoelectric layer 52. Similarly, the second piezoelectric stacks 34 include an electrode 37 stacked on the second TEOS layer 43, a piezoelectric layer 38 stacked on the electrode 37, and an electrode 39 stacked on the piezoelectric layer 38.

Figure 7D:
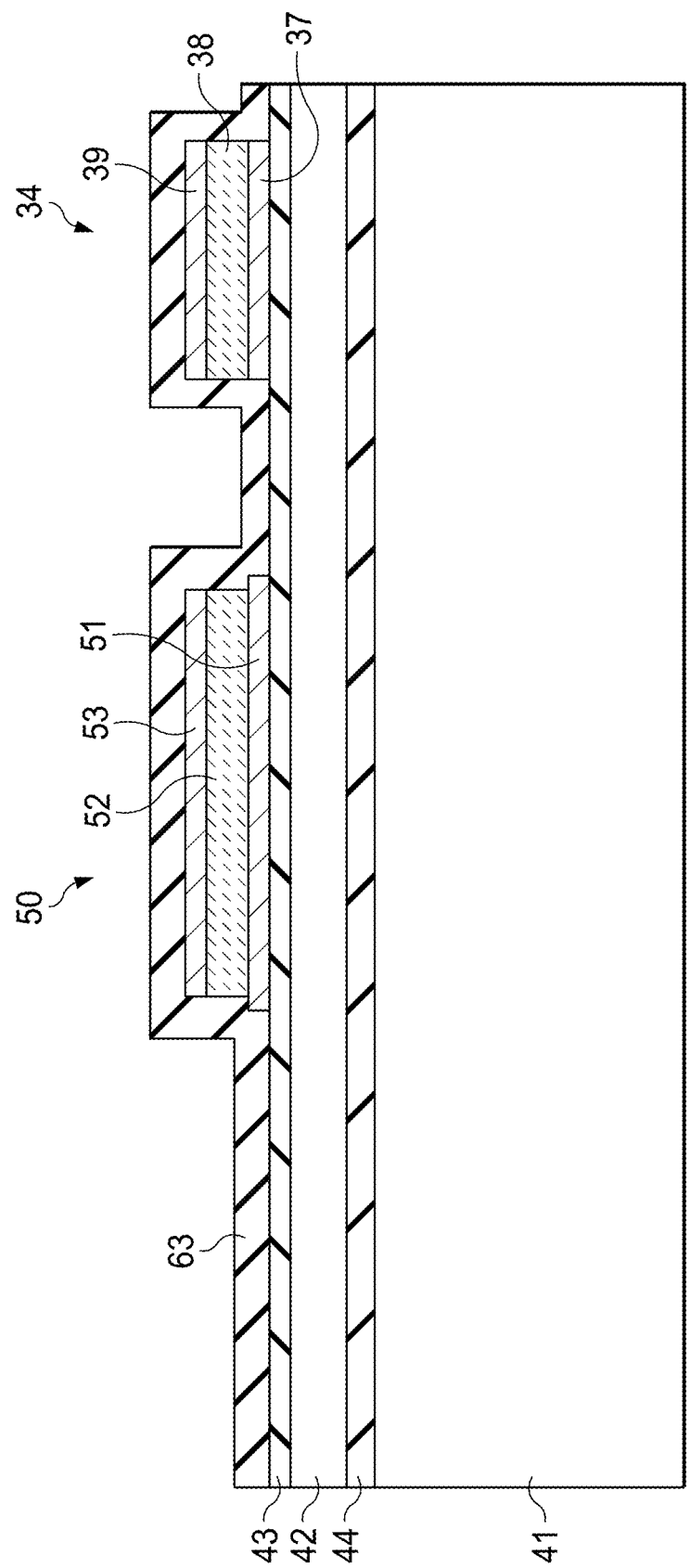
Figure 7E:
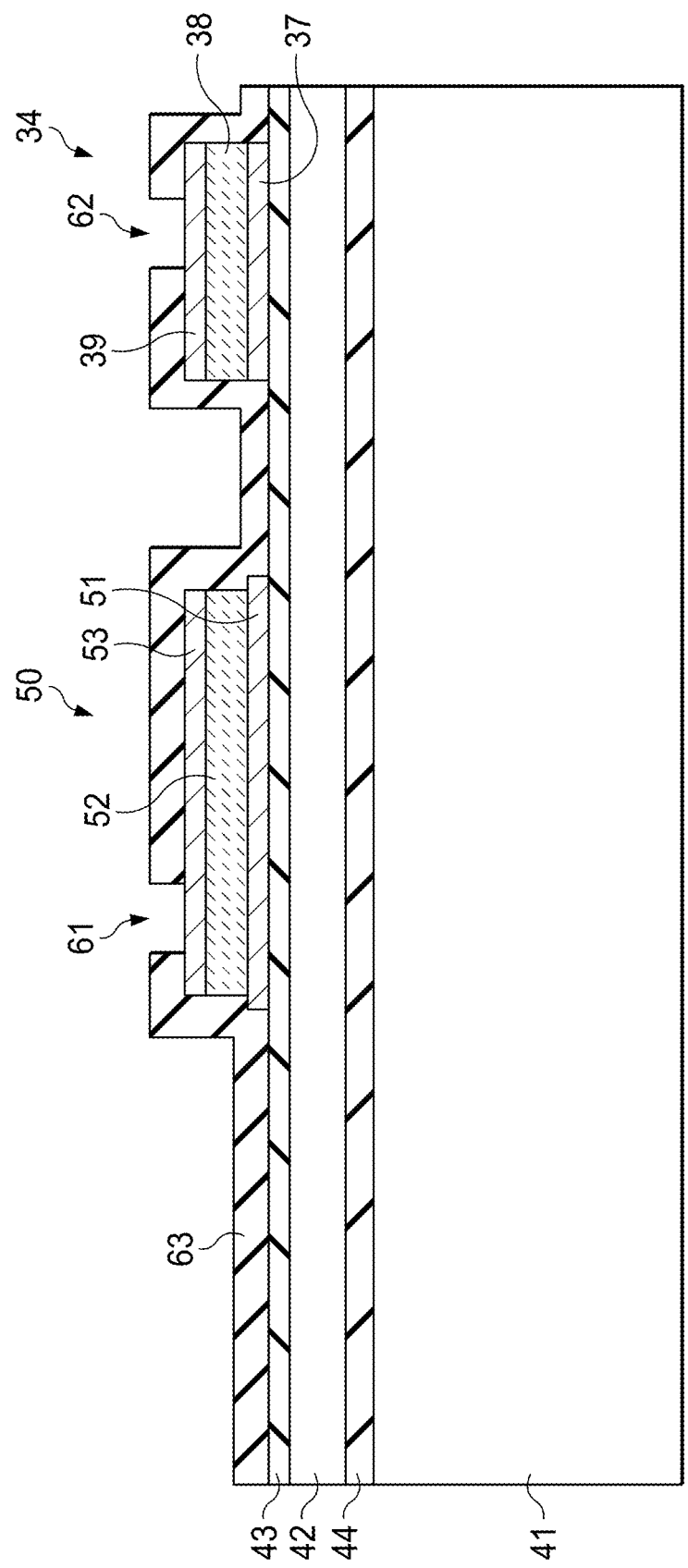
Figure 7F:
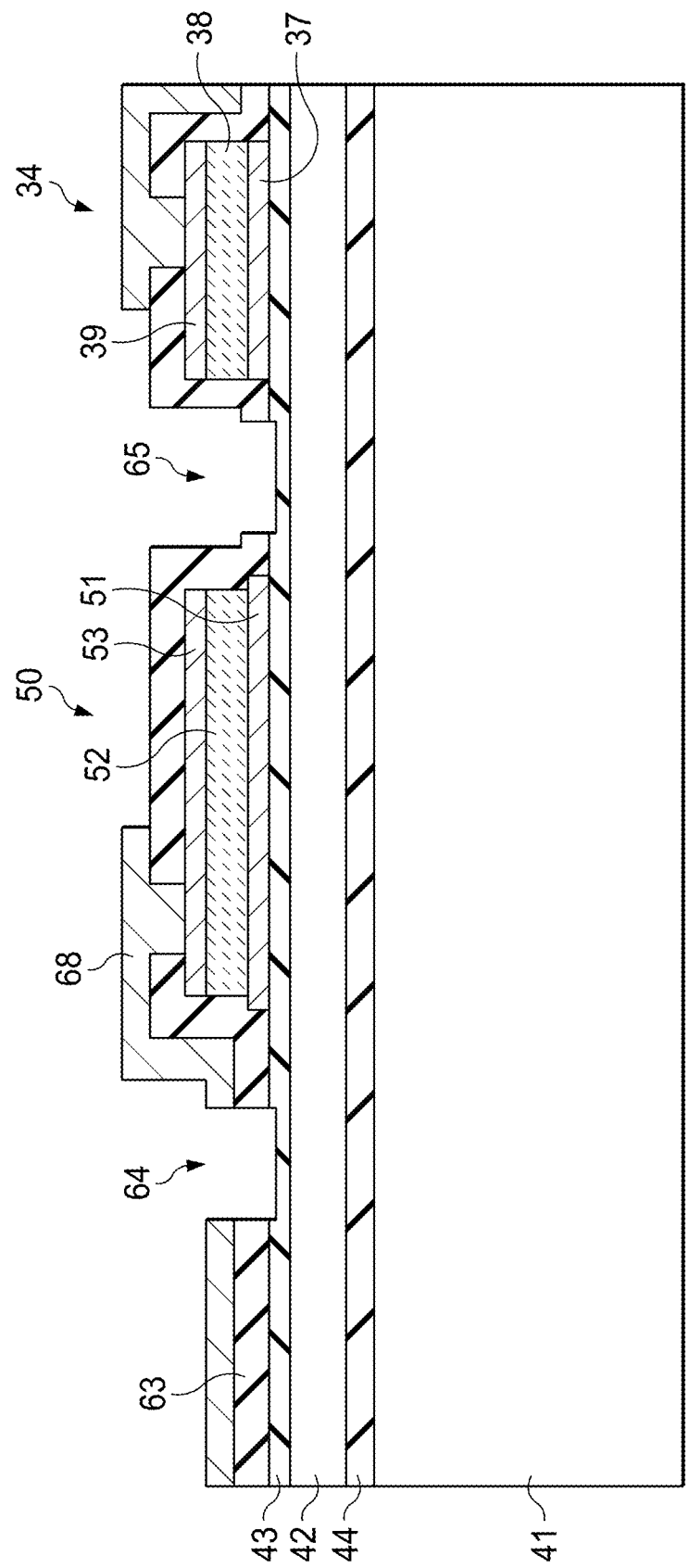
Figure 8C:
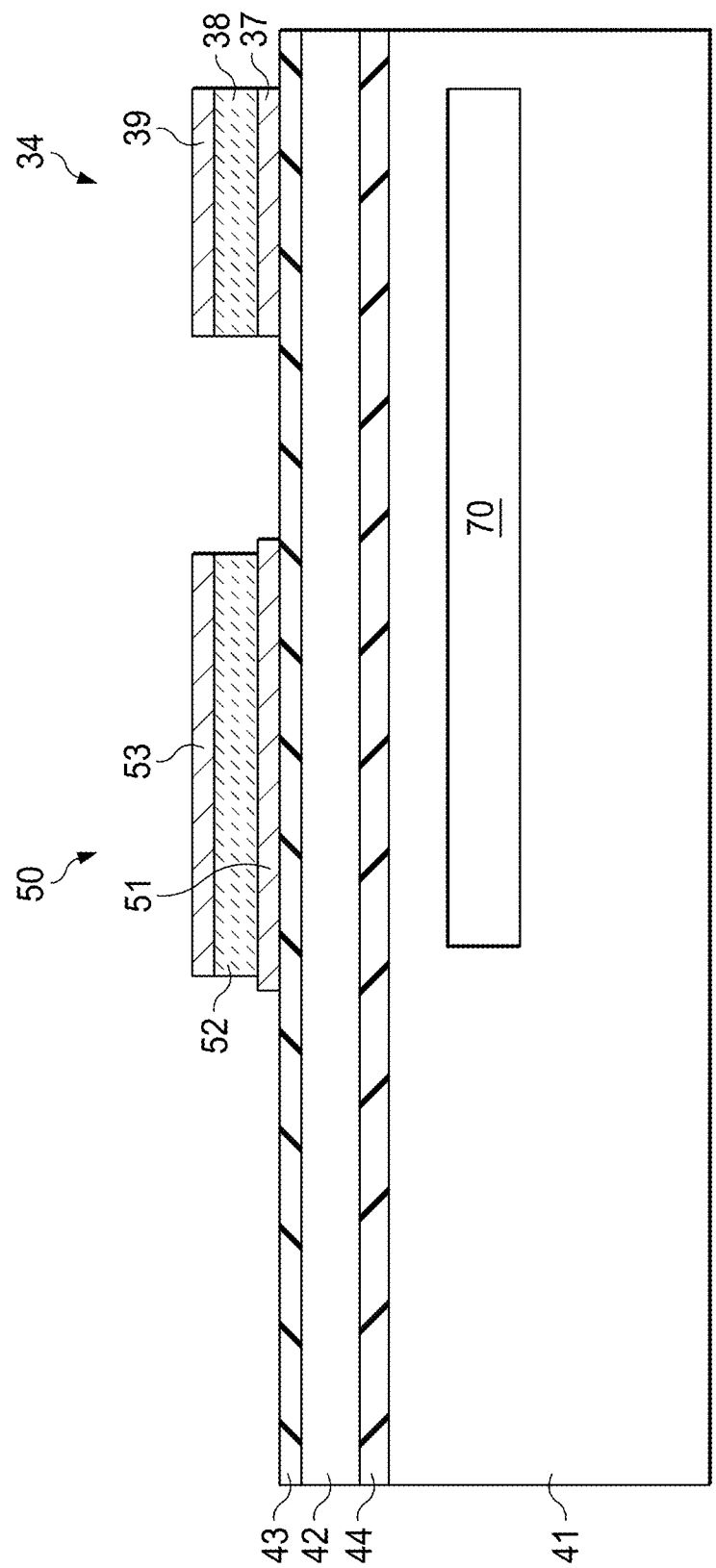
Figure 8D:
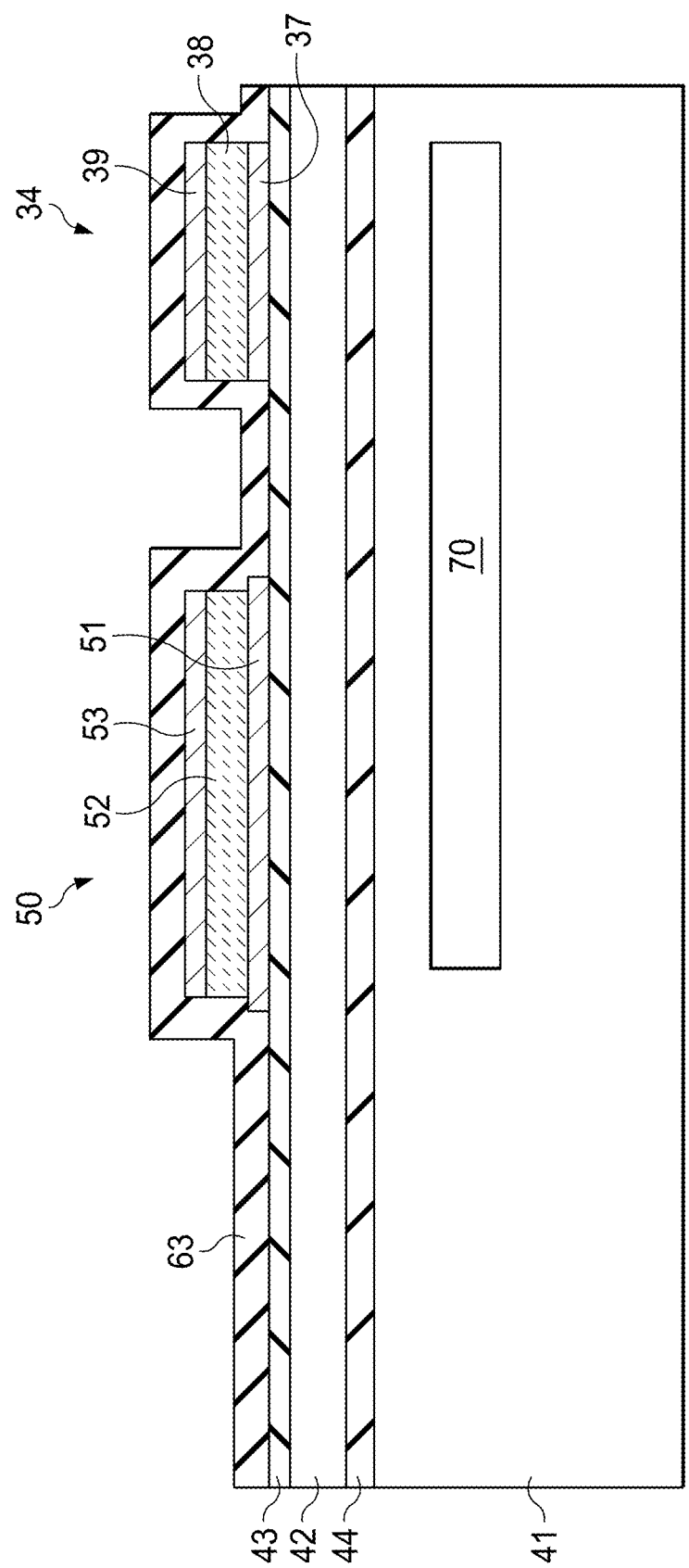
Figure 8E:
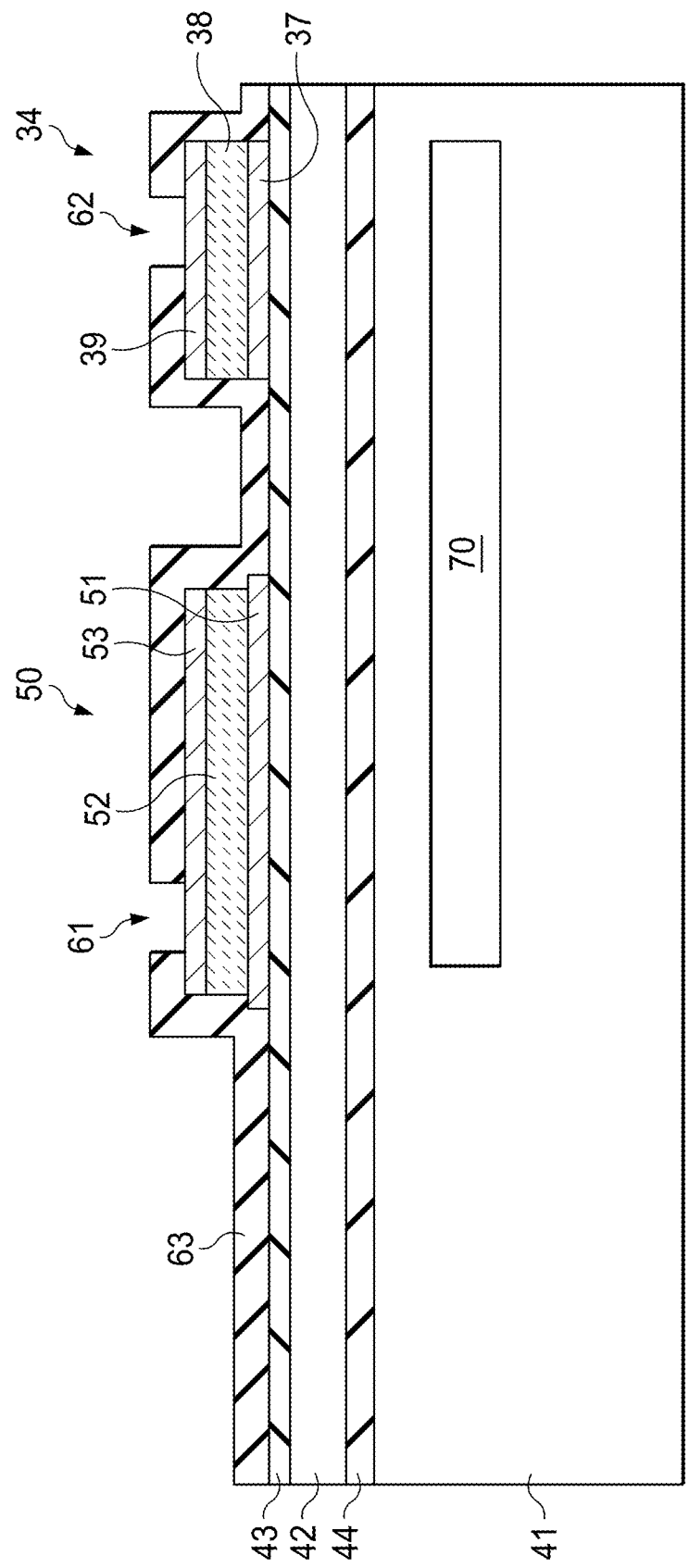
Figure 8F:
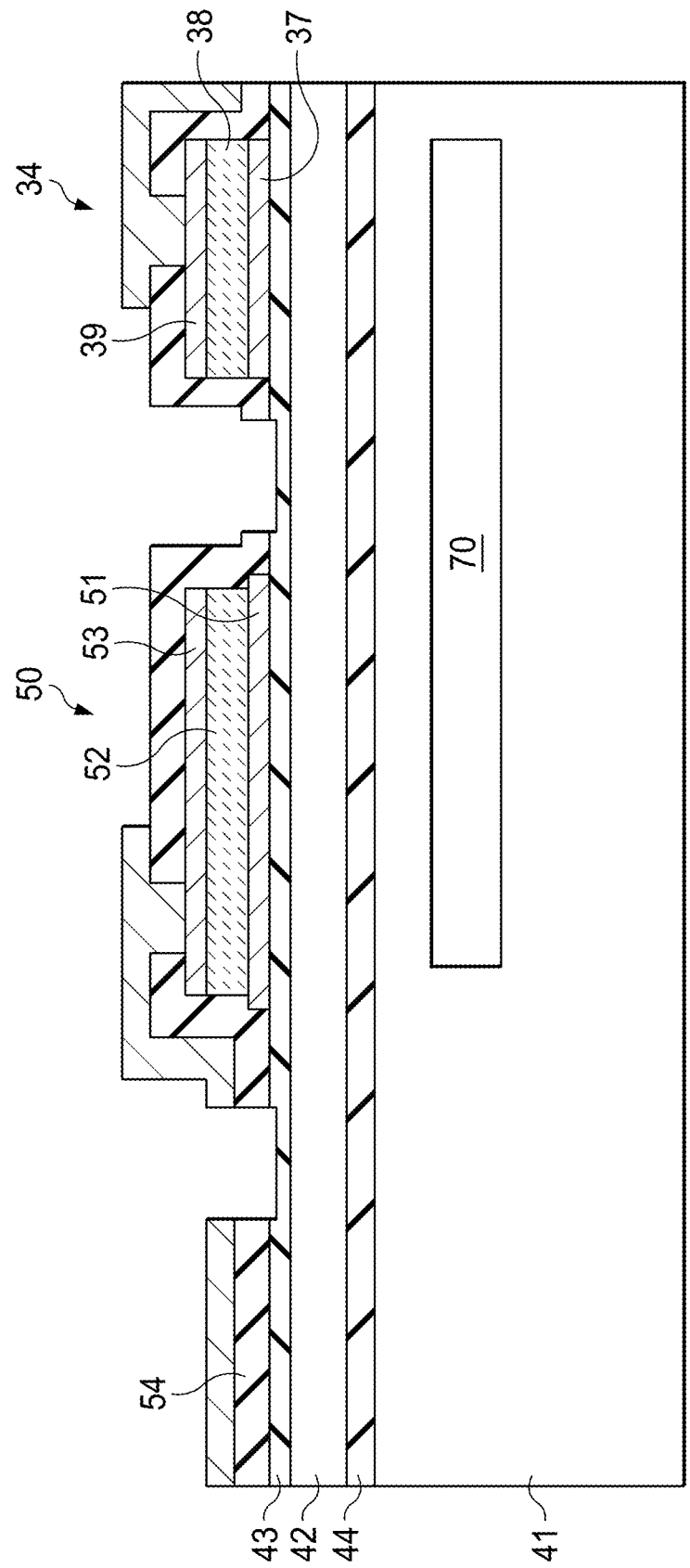

An undoped silicon glass (USG) layer 63 is then deposited, as shown in FIG. 7D, and patterned to form openings 61 and 62 atop the electrodes 53 and 39, as shown in FIG. 7E. Next, a metal layer 68 is deposited and patterned, as shown in FIG. 7F. The wafer is then flipped and etched at the backside to release and form the membrane 32, as shown in FIG. 4, completing the formation of the array 12.

Formation of an alternative embodiment is shown in FIGS. 8A-8F. The formation is otherwise the same as described with reference to FIGS. 7A-7F, except here a buried subsurface cavity 70 is formed within the substrate 41 prior to deposition of the first TEOS layer 44, and this subsurface cavity 70 serves the same function of the cavity 40 in the previously described embodiment.

Figure 9:
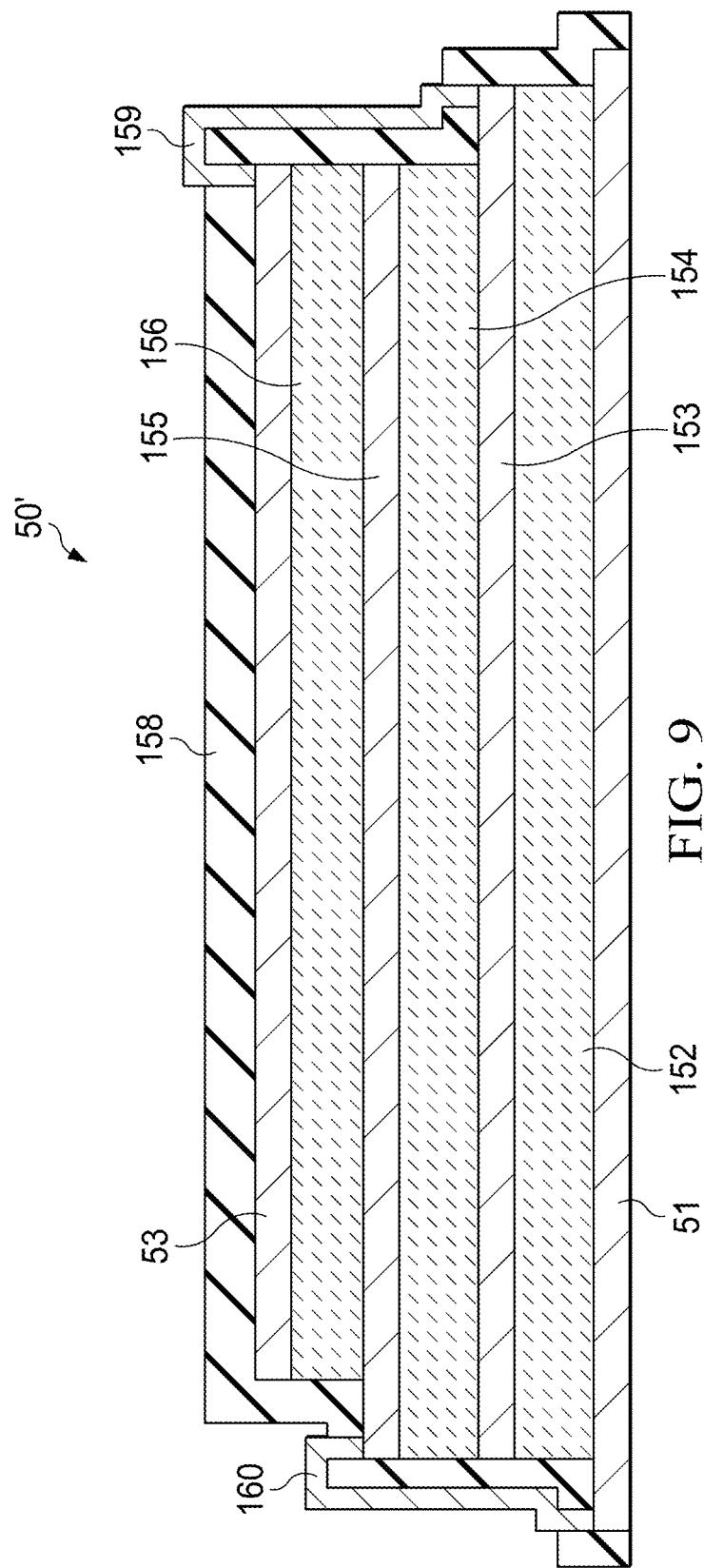
FIG. 9 is a cross sectional view of an alternate design for the transmitter PMUTs in the membranes described above.

The various piezoelectric stacks described above were described as including a piezoelectric layer sandwiched between top and bottom electrodes. However, the piezoelectric stacks may instead include multiple piezoelectric layers. Refer now to FIG. 9, showing an alternative piezoelectric stack 50' design such as may be used as the transmitter PMUT in the embodiments described above. The piezoelectric stack 50' includes a piezoelectric layer 152 sandwiched between electrodes 51 and 153, a piezoelectric layer 154 sandwiched between electrodes 153 and 155, and a piezoelectric layer 156 sandwiched between electrodes 155 and 53. Notice that the electrode 51 extends past the side ends of the piezoelectric layer 152, that the electrode 153 extends past one side end of the piezoelectric layer 154, and that the electrode 155 extends past one side end of the piezoelectric layer 156.

A dielectric layer 158 covers the top face of the electrode 53 as well as portions of the top faces of electrode 155, 153, and 51. The dielectric layer 158 covers the side ends of electrodes 53, 155, 153, and 151, as well as the side ends of the piezoelectric layers 156, 154, and 152. An interconnection 160 is in electrical and physical contact with the top face of electrodes 155 and 51, and an interconnection 159 is in electrical and physical contact with the top face of electrodes 53 and 153. It follows from this that electrodes 51 and 155 are actuated in parallel and electrodes 53 and 153 are actuated in parallel.

It is clear that modifications and variations may be made to what has been described and illustrated herein, without thereby departing from the scope of this disclosure, as defined in the annexed claims.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An array of ultrasound devices, each ultrasound device comprising:
   a membrane;
   a first piezoelectric stack carried by the membrane and forming, together with the membrane, a first piezoelectric micromachined ultrasonic transducer (PMUT); and
   a plurality of second piezoelectric stacks carried by the membrane and positioned about a periphery thereof, each second piezoelectric stack forming, together with the membrane, a second PMUT;
   wherein, during operation, the first piezoelectric stack is configured to vibrate the membrane in response to application of an alternating voltage to the first piezoelectric stack to thereby generate at least one outgoing ultrasonic pulse toward a target; and
   wherein, during operation, the plurality of second piezoelectric stacks are configured to generate sense voltages in response to bending thereof induced by vibration of the membrane by incoming ultrasonic reflections off the target.

2. The array of ultrasound device of claim 1, wherein each ultrasound device further comprises a plurality of cutouts formed in the membrane about the periphery thereof, each cutout being formed in a dielectric layer that is a top layer of the membrane.

3. The array of ultrasound devices of claim 1, wherein the first piezoelectric stack is carried atop a central portion of the membrane.

4. The array of ultrasound devices of claim 3, wherein the plurality of second piezoelectric stacks are three in number and carried atop the periphery of the membrane so that the plurality of second piezoelectric stacks form a Y-shape, X-shape, or star-shape.

5. The array of ultrasound devices of claim 4, wherein the Y-shape, X-shape, or star-shape is symmetric.

6. The array of ultrasound devices of claim 3, wherein the plurality of second piezoelectric stacks are carried atop the periphery of the membrane so that the plurality of second piezoelectric stacks are spaced equidistant from one another.

7. The array of ultrasound devices of claim 1, further comprising control circuitry configured to drive the first piezoelectric stack to cause the first piezoelectric stack to generate the at least one outgoing ultrasonic pulse while monitoring output from the plurality of second piezoelectric stacks to determine an elapsed time between emission of the at least one outgoing ultrasonic pulse and receipt of the incoming ultrasonic reflections.

8. The array of ultrasound devices of claim 7, wherein the control circuitry also monitors the output from the plurality of second piezoelectric stacks to detect the vibration of the membrane caused by generation of the at least one outgoing ultrasonic pulse and to determine whether a given first piezoelectric stack has malfunctioned based upon a lack of detection of the vibration of the membrane.

9. The array of ultrasound devices of claim 1, wherein each of the plurality of second piezoelectric stacks is lesser in diameter than the first piezoelectric stack.

10. An array of ultrasound devices, each ultrasound device comprising:
    a membrane;
    a first piezoelectric stack carried by the membrane and forming, together with the membrane, a first piezoelectric micromachined ultrasonic transducer (PMUT);
    a plurality of second piezoelectric stacks carried by the membrane and positioned about a periphery thereof, each second piezoelectric stack forming, together with the membrane, a second PMUT; and
    a plurality of cutouts formed in the membrane about the periphery thereof, each cutout being formed in a dielectric layer that is a top layer of the membrane.

11. The array of ultrasound devices of claim 10, wherein the first piezoelectric stack is carried atop a central portion of the membrane.

12. The array of ultrasound devices of claim 11, wherein the plurality of second piezoelectric stacks are three in number and carried atop the periphery of the membrane so that the plurality of second piezoelectric stacks form a Y-shape, X-shape, or star-shape.

13. The array of ultrasound devices of claim 12, wherein the Y-shape, X-shape, or star-shape is symmetric.

14. The array of ultrasound devices of claim 11, wherein the plurality of second piezoelectric stacks are carried atop the periphery of the membrane so that the plurality of second piezoelectric stacks are spaced equidistant from one another.

15. The array of ultrasound devices of claim 10, wherein each of the plurality of second piezoelectric stacks is lesser in diameter than the first piezoelectric stack.

16. An ultrasound device, comprising:
    a membrane;
    a first piezoelectric stack carried by the membrane and forming, together with the membrane, a first piezoelectric micromachined ultrasonic transducer (PMUT);
    a plurality of second piezoelectric stacks carried by the membrane and positioned about a periphery thereof, each second piezoelectric stack forming, together with the membrane, a second PMUT, each second piezoelectric stack being lesser in diameter than the first piezoelectric stack;
    a plurality of cutouts formed in the membrane about the periphery thereof, each cutout being formed in a dielectric layer that is a top layer of the membrane; and
    control circuitry configured to drive the first piezoelectric stack to cause the first piezoelectric stack to generate the at least one outgoing ultrasonic pulse while monitoring output from the plurality of second piezoelectric stacks to determine an elapsed time between emission of the at least one outgoing ultrasonic pulse and receipt of the incoming ultrasonic reflections.

17. The array of ultrasound devices of claim 16, wherein the first piezoelectric stack is carried atop a central portion of the membrane.

18. The array of ultrasound devices of claim 17, wherein the plurality of second piezoelectric stacks are three in number and carried atop the periphery of the membrane so that the plurality of second piezoelectric stacks form a Y-shape, X-shape, or star-shape.

19. The array of ultrasound devices of claim 18, wherein the Y-shape, X-shape, or star-shape is symmetric.

20. The array of ultrasound devices of claim 16, wherein the plurality of second piezoelectric stacks are carried atop the periphery of the membrane so that the plurality of second piezoelectric stacks are spaced equidistant from one another.

* * * * *